US008830727B2

(12) United States Patent
Yi et al.

(10) Patent No.: US 8,830,727 B2
(45) Date of Patent: Sep. 9, 2014

(54) MULTI-LEVEL MEMORY CELL WITH CONTINUOUSLY TUNABLE SWITCHING

(75) Inventors: Wei Yi, Mountain View, CA (US); Feng Miao, Mountain View, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 341 days.

(21) Appl. No.: 13/278,581

(22) Filed: Oct. 21, 2011

(65) Prior Publication Data
US 2013/0100726 A1 Apr. 25, 2013

(51) Int. Cl.
G11C 11/00 (2006.01)
G11C 11/56 (2006.01)
G11C 27/00 (2006.01)
G11C 29/50 (2006.01)
G11C 13/00 (2006.01)

(52) U.S. Cl.
CPC .... G11C 29/50008 (2013.01); G11C 2013/009 (2013.01); G11C 13/0011 (2013.01); G11C 13/004 (2013.01); G11C 11/5685 (2013.01); G11C 13/0069 (2013.01); G11C 11/56 (2013.01); G11C 13/0007 (2013.01); G11C 27/005 (2013.01); G11C 2013/0078 (2013.01); G11C 13/0004 (2013.01); G11C 11/5678 (2013.01); G11C 2013/0076 (2013.01); G11C 2213/15 (2013.01); G11C 13/0002 (2013.01); G11C 13/00 (2013.01); G11C 2013/0083 (2013.01)
USPC .......................................................... 365/148

(58) Field of Classification Search
USPC ............. 365/46, 94, 100, 129, 148, 158, 163; 257/2–5, 9, 310, E21.35; 438/95, 96, 438/135, 166, 240, 365, 482, 486, 597, 785
See application file for complete search history.

(56) References Cited

U.S. PATENT DOCUMENTS

| 7,426,131 B2* | 9/2008 | Gilbert .......................... 365/148 |
| 2007/0121368 A1* | 5/2007 | Gilbert .......................... 365/148 |
| 2008/0130381 A1 | 6/2008 | VanBuskirk et al. |
| 2009/0154222 A1 | 6/2009 | Chien et al. |
| 2009/0273964 A1 | 11/2009 | Yamazaki et al. |
| 2009/0279343 A1 | 11/2009 | Chang et al. |
| 2011/0242874 A1 | 10/2011 | Chien et al. |

OTHER PUBLICATIONS

Bozano, L. D., et al., "Mechanism for Bistability in Organic Memory Elements," Applied Physics Letters, Jan. 26, 2004, pp. 607-609, vol. 84, No. 4.
Seo, S., et al., "Reproducible Resistance Switching in Polycrystalline NiO Films," Applied Physics Letters, Dec. 6, 2004, pp. 5655-5557, vol. 85, No. 23.
Rebello, A., et al., "Negative Differential Resistance and Pulsed Current Induced Multi-level Resistivity Switching in Charge Ordered and Disordered Manganites," submitted May 12, 2008, pp. 1-20, Available at http://arxiv.org//ftp/arxiv/papers/0805/0805.1643.pdf.
Lei, Bao, et al., "Statistical Characterization of the Memory Effect in Polyfluorene Based Non-volatile Resistive Memory Devices," Submitted to Organic Electronics, May 23, 2009, Available at http://www.freewebs.com/leibao/memory_preprint.pdf.
Wang, Sheng-Yu, et al., "Multilevel Resistive Switching in Ti/CuxO/Pt Memory Devices," Journal of Applied Physics, pp. 114110-114110-6, vol. 108, Issue 11, Dec. 2010.

* cited by examiner

Primary Examiner — Harry W Byrne

(57) ABSTRACT

The present disclosure provides a data storage device that includes multi-level memory cells. The data storage device may include circuitry configured to write data to the multi-level memory cell. The write circuitry may include compliance circuitry configured to implement continuously tunable switching. The write circuitry may be configured to select a compliance mode for the switching, the compliance mode being selected from the group comprising current compliance and voltage compliance.

13 Claims, 8 Drawing Sheets

100

300

400

408

MULTI-LEVEL MEMORY CELL WITH CONTINUOUSLY TUNABLE SWITCHING

BACKGROUND

A multi-level cell (MLC) is a memory element that can be used to store more than a single bit of information (here single bit means two distinctive logic states, termed '0' and '1' states, in a binary system). A resistive memory device, such as memristor, is one type of memory element that can be used as a multi-level cell. A memristor is a two-terminal electrical element whose resistance can be switched by applying electric signals (voltage or current) beyond certain threshold levels. The bit value stored to the memristor may correspond to a range of resistance values of the memristor. The memristor can be set to a specific bit value by controlling the maximum level of current applied to the memristor during a switching event, thereby controlling the final state of resistance developed in the memristor. During a subsequent read of the memristor, a read voltage is applied to the memristor and the resulting current indicates the bit value that was previously stored to the element. The read voltage is small enough so that a resistive switching is not incurred by the read operation.

In a resistive multi-level cell, such as a multi-level memristor, there is usually no suitable technique for finely controlling the off-state resistance. Thus, the bit value is typically represented by two or more on-states and a single off state. The accessible on-state resistance range is limited. For example, the final on-state resistances may be less than approximately 10 kohm. Meanwhile, the single off-state may be represented by a range of resistances that spread much broader than the distribution of on-state resistances. Additionally, the switching of the cells is typically not continuously tunable. In other words, changing the memristor's bit value is often accomplished in a two-step process, wherein the memristor is first driven to the off state and then driven to a new on-state corresponding to the desired bit value.

BRIEF DESCRIPTION OF THE DRAWINGS

Certain embodiments are described in the following detailed description and in reference to the drawings, in which.

DETAILED DESCRIPTION

Figure 1:
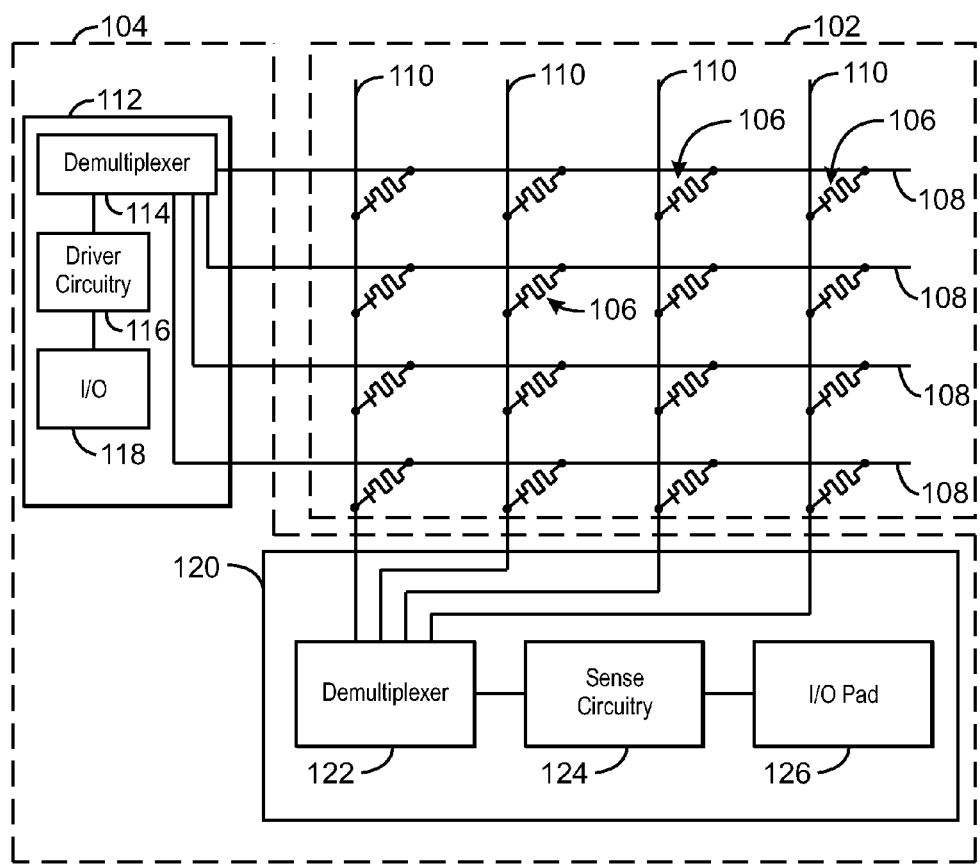
FIG. 1 is a block diagram of a data storage device in accordance with embodiments.

Embodiments described herein relate to a multi-level cell that has a plurality of on states as a well as a plurality of off states. In embodiments, the multilevel cell may be a resistive, multi-level cell such as a memristor. For purposes of the present description, the multi-level cell may be referred to herein simply as a "cell," and is understood to apply to resistive memory cells as well as other types of multi-level memory cells. The cell 106 may include a multi-level resistive memory element such as a memristor, a Phase Change Material resistor, a conductive bridge resistor, a transition metal oxide based resistor, and the like. As used herein, the term resistive memory element refers to a memory element wherein the logical state of the memory element (in other words, the particular bit value stored to the memory element) is indicated by the resistance of the memory element. In resistive memory elements, the resistance exhibited by the memory element can be changed, for example, by applying voltage across or current through the resistive memory element beyond certain threshold levels.

Each specific bit value that can be written to the cell may correspond to a range of resistance values exhibited by the cell. For example, in a cell capable of storing four bit values, the high-resistance state (the "off" state) may be used to represent a bit value of 0 (=00 in binary system) and progressively lower resistance states may be used to represent bit values of 1 (=01 in binary system), 2 (=10 in binary system), and 3 (=11 in binary system), wherein higher bit values represents progressively lower resistances. As used herein, the term "ON-switching" refers to setting the cell to a lower resistance state, and the term "OFF-switching" refers to setting the cell to a higher resistance state.

Setting the resistance of the cell, and thus the bit value, may be accomplished by using current compliance, voltage compliance, or a combination thereof. The term "current compliance" refers to a technique in which the maximum level of current applied to the cell is controlled by applying a specified current limit to the cell. The term "voltage compliance" refers to a technique in which the maximum level of voltage applied to the cell is controlled by applying a specified voltage limit to the cell. In accordance with embodiments, the ON-switching and OFF-switching of the cell is continuously tunable, which means that the cell can be driven to any other bit-value regardless of the starting resistance level of the cell. With regards to ON-switching, this means that the cell can be switched from any resistance level to any lower resistance level. For example, if the starting bit value of the cell is 1, the cell can be switched directly to a bit value of 2 or 3 without first resetting the bit value to 0. With regards to OFF-switching, this means that the cell can be switched from any resistance level to any higher resistance level. For example, if the starting bit value of the cell is 3, the cell can be switched directly to a bit value of 0, 1, or 2.

Figure 2:
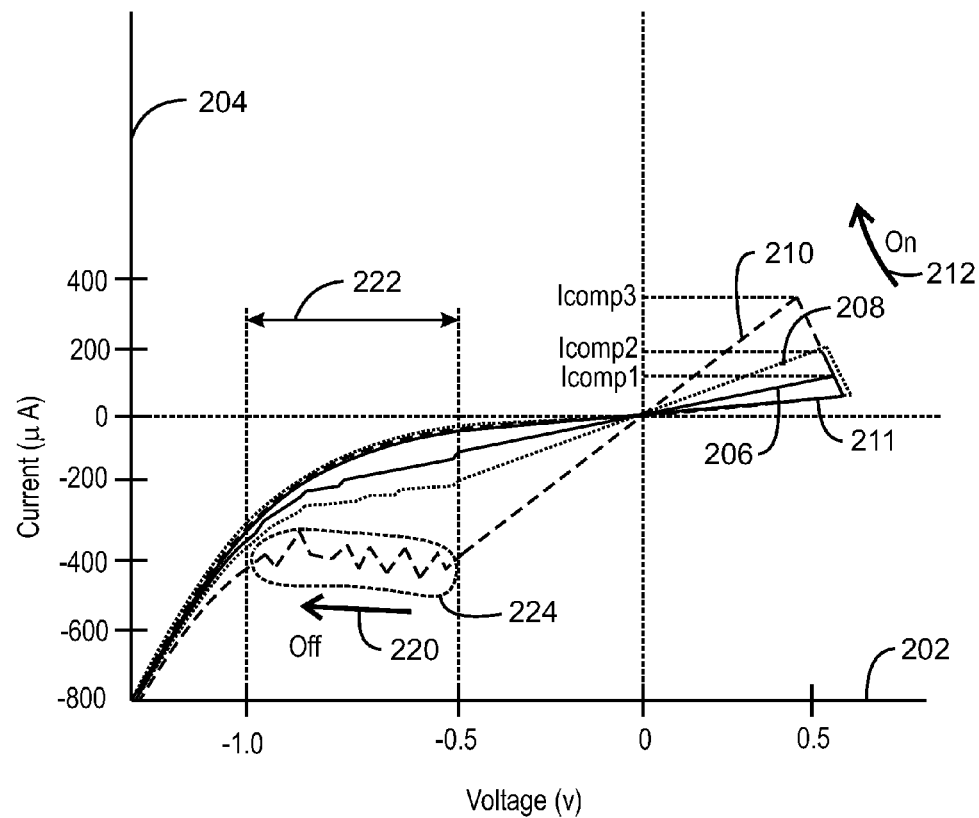
FIG. 2 is a current-voltage diagram of a multi-level memory cell in accordance with embodiments.

It has been discovered that current compliance may be problematic during OFF-switching of a resistive multi-level cell due to a possible inflection zone in the current-voltage characteristics of the cell, as explained further in relation to FIG. 2. A write protocol in accordance with embodiments can use either current compliance or voltage compliance during OFF-switching of a cell, depending on whether the cell exhibits such an inflection zone. The improved OFF-switching technique enables finer control of the off-state resistance. Using the write protocol disclosed herein, a cell with multiple off states may be realized, which increases the number of bits that can be stored to the cell. The write protocol also simplifies the process of switching the multi-level cell to a higher resistance level. For example, rather than switching the cell fully off before switching the cell to the desired resistance level, the cell can be switched from a low resistance value to a higher resistance value directly. In other words, for the four bit cell described above, the cell could be switched from a bit value of 3 to a bit value of 1 or 2 directly in one step. The simplified process for writing the cell makes cell switching faster and increases the useful life of the cell by reducing the number of times that the cell is likely to be driven to the full off state.

FIG. 1 is a block diagram of a data storage device in accordance with embodiments. The data storage device 100 may be incorporated into any suitable electronic device that uses electronic memory, such as a general purpose computer, printer, copier, mobile phone, smart phone, tablet PC, or USB flash drive, among others. As shown in FIG. 1, the data storage device 100 may include a memory array 102 and a peripheral memory controller circuitry 104. The memory array 102 may include a matrix of cells 106 arranged in rows and columns.

The cells 106 may be any type of multi-level memory storage element, including resistive memory elements such as memristors, for example. Many different materials with their respective suitable dopants can be used as the switching material of the cell. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The listing of possible switching materials is not exhaustive and do not restrict the scope of the present invention. The dopant species used to alter the electrical properties of the switching material depends on the particular type of switching material chosen, and may be cations, anions or vacancies, or impurities as electron donors or acceptors. For instance, in the case of transition metal oxides such as TiO2, the dopant species may be oxygen vacancies, in the case of TaOx (here $0<x<2.5$ is an adjustable parameter), the dopant species may be oxygen anions. For GaN or AlN, the dopant species may be nitride vacancies or sulfide ions. For compound semiconductors, the dopants may be n-type or p-type impurities. In embodiments, the cells 106 may be TaOx and HfOx based memristors. For example, the cells may be structures such as Metal/TaOx/Metal, Metal/HfOx/Metal, or a bilayer structure such as Metal/TaOx/NbO2/Metal, Metal/HfOx/Ti4O7/Metal, Metal/TaOx/Ti4O7/Metal, Metal/HfOx/NbO2/Metal.

A set of conductive electrodes, referred to herein as row lines 108, extend over one side of the array of cells 106. Each row line 108 makes electrical contact with the cells 106 of a particular row. A set of conductive electrodes, referred to herein as column lines 110, extend over the other side of the array of cells 106. Each column line 110 makes electrical contact with the cells 106 of a particular column. Each cell 106 lies at the cross point of one row line 108 and one column line 110. Each cell 106 may be selected for writing or reading, by activating the particular row line 108 and column line 110 associated with that cell 106.

The memory controller 104 may include row line control circuitry 112 and column line control circuitry 120. The row line control circuitry 112 may be coupled to the cells 106 through the respective row lines 108 and configured to activate a particular row line 108 for the reading or writing of a particular cell 106 associated with the row line 108. For example, the row line control circuitry 112 may include one or more multiplexers and/or demultiplexers for selecting a particular one of the row lines 108. For the sake of clarity, only one demultiplexer is shown. However, it will be appreciated that the row line control circuitry 112 can include any suitable number of multiplexers and/or demultiplexers. For example, in embodiments, each row line 108 and column line 110 is connected to a demultiplexer that has three or more inputs, so that when applying the write voltages to the selected row line 108 and the selected column line 110, all the unselected rows and columns are connected to ground. The row line control circuitry 112 may also include write and read driver circuitry 116 that controls the writing of data to the selected cell and reading of data from the selected cell by supplying appropriate electrical signals (voltage and current), and an I/O pad 118 for receiving instructions, for example, from a processor.

The column line control circuitry 120 may be coupled to the cells 106 through the respective column lines 110. The column line control circuitry 120 may include a demultiplexer 122, sense circuitry 124, and I/O pad 126. The demultiplexer 122 may be configured to selectively couple the column line 110 of the selected cell 106 to the sense circuitry 124, which determines the bit value stored to the cell. The I/O pad 126 is used for sending the stored bit information to external circuitry. The row line control circuitry 112 and the column line control circuitry 120 act in concert to access individual cells 106 by activating the corresponding row line 108 and column line 110 coupled to the selected cell 106. It will be appreciated that the row line control circuitry 112 and the column line control circuitry 120 described herein are examples of circuitry that may be used in an exemplary embodiment for accessing the cells 106. Other configurations known to those skilled in the art may be used for accessing the cells 106 in accordance with the present techniques.

During a write operation, the row line control circuitry 112 writes information to the selected cell 106 by applying a voltage to the specific row line 108 corresponding to the selected cell 106. The demultiplexer 122 of the column line control circuitry 120 may address the selected cell 106 by coupling the cell 106 to the sense circuitry 124. Current then flows through the selected cell 106. When the current or voltage surpasses a certain threshold, switching of the cell 106 occurs, in effect storing a logical bit to the cell 106. For example, if the memory element included in the cell 106 is a memristor, the current through (or voltage across) the memristor beyond a certain threshold level changes the memristor's resistance. In embodiments, a constant voltage threshold of approximately 0.5 volts will cause switching to occur. The change in the resistance can be detected during a subsequent read operation. As explained above, the cell may be configured to store a plurality of bit values. For example, the range of possible bit values may be 0 to 3 (two bits per cell in binary system), 0 to 7 (three bits per cell in binary system), or any other suitable range. Each bit value may be represented by the cell as a range of resistance values.

The writing of each cell 106 may be accomplished using current compliance or voltage compliance. Further, a determination may be made while writing the cell 106 regarding whether to apply current compliance or voltage compliance to achieve the desired resistance level. The choice of current compliance or voltage compliance for any particular cell may vary from write operation to write operation. In embodiments, current compliance may be used for ON-switching, and during OFF-switching a selection may be made between current compliance and voltage compliance depending on the electrical characteristics exhibited by the cell during OFF-switching. The selection of a particular compliance mode may be better understood with reference to the description of FIGS. 2 and 3 below.

During a read operation, the row line control circuitry 112 may first address a selected cell 106, then apply a specified voltage to the corresponding row line 108, and the demultiplexer 122 may couple the column line 110 corresponding to the selected cell 106 to the sense circuitry 124. The resulting current detected by the sense circuitry 124 indicates the resistance state of the cell 106 and identifies the bit value stored to the cell. For example, the sense circuitry 124 may include a trans-impedance amplifier (TIA) that converts the current signal to a voltage signal, and an analog-to-digital converter that converts the voltage signal into digital data. The digital result of the read may then sent to the I/O pad 126. The row line control circuitry 112 and the column line control circuitry 120 may include encoder and decoder circuitry to control the stored bit pattern in the memory array 102 for various purposes.

FIG. 2 is a plot showing an example of the current-voltage relationship of a multi-level memory cell in accordance with embodiments. The current-voltage plot 200 shows an example of switching characteristics that may be exhibited by a multi-level memory cell, such as one of the cells 106 shown in FIG. 1. As shown in FIG. 2, the x-axis 202 represents voltage in volts and the y-axis 204 represents current in micro-amperes. It will be appreciated that the specific current and voltage values shown in FIG. 2 are provided for illustration purposes only and are not intended to be limiting. The current and voltage characteristics of a multi-level memory cell in accordance with embodiments may vary depending on the specific design choices of a particular implementation.

FIG. 2 illustrates the possible electrical characteristics exhibited by the cell during ON-switching and OFF-switching. For purposes of clarity, FIG. 2 illustrates a cell configured to store one of four bit values. However, it will be appreciated that any suitable number of bit values can be stored to the cell in accordance with embodiments. Based on the foregoing description, it will be appreciated that the electrical characteristics of the cell may vary depending on the specific bit value stored to the cell. As shown in example diagram of FIG. 2, the solid line 206 represents the electrical characteristics of the cell when the cell has been set to a bit value of 1, the dotted line 208 represents the electrical characteristics of the cell when the cell has been set to a bit value of 2, and the dashed line 210 represents the electrical characteristics of the cell when the cell has been set to a bit value of 3. A bit value of zero may be referred to as the "full off state," which correspond to the highest resistance value of the cell as shown by the solid line 211. As used herein, the current polarity is described as "positive" if the direction of current flowing through the cell causes the ON-switching of the cell to occur. Conversely, negative current is current in the direction that causes the OFF-switching to occur.

During ON-switching, the cell may be subjected to a positive voltage, which induces positive current through the cell. The occurrence of ON-switching is indicated by a sudden drop of the cell resistance that causes the slope of current-voltage trace to surge, as indicated by the arrow 212. During the ON-switching event, which can occur in a time scale of several nano-seconds or even less, the fast decrease of the cell resistance causes a corresponding surge in the current through the cell in accordance with Ohm's law ($I=V/R$). The ON-switching is referred to as "continuously tunable," meaning that the cell can be set to any desired resistance within a suitable range by applying the corresponding current compliance (essentially placing a ceiling that the current can reach during the ON-switching event). The example configuration of FIG. 2 shows three current compliance levels depicted by the arrows, each of which corresponds to a different bit value. For example, the current compliance Icomp1 may correspond to a bit value of 1, the current compliance Icomp2 may correspond to a bit value of 2, and the current compliance Icomp3 at may correspond to a bit value of 3. Furthermore, the cell can be set to a lower resistance state from any initial resistance state. For example, although not shown in FIG. 2, the cell can be switched from a bit value of 1 to a bit value of 2 or 3 directly, without first resetting the cell to zero.

During OFF-switching, the cell is subjected to a negative voltage which induces a negative current in the cell. The OFF switching event is indicated by the arrow 220, during which the slope of current-voltage trace suddenly decreases, reflecting an increase in the cell resistance. The final state of the cell after OFF-switching occurs is highly nonlinear and asymmetric (curve 211), indicating that an insulating regime in the device has been developed. The state of the cell may change once the negative voltage exceeds a switching threshold, for example, −0.5 volts, as shown by the switching zone 222. Resetting the bit value in a typical multi-level device is generally accomplished in a two stage process. The cell is first switched to the full off state by setting the cell to the highest resistance value (curve 211) corresponding to a bit value of zero. The cell then undergoes on-switching to set the bit to the desired value. Thus, for example, if the current bit value is 3, setting the cell to a bit value of 2 would involve setting the bit value to zero and then setting the bit value to 2. In other words, for a typical multilevel cell, the cell is continuously tunable during the ON-switching, but not the OFF-switching. In embodiments of the present techniques, the OFF-switching is continuously tunable so that the cell can be set to a higher resistance bit value directly in one step. In other words, the negative current can be terminated when the cell 106 has reached a current or voltage threshold corresponding to the desired resistance indicative of the desired bit value. Following the example set forth above, the OFF-switching of the cell may terminate once the cell reaches the resistance level corresponding to a bit value of 2. Furthermore, in a TaOx based memristor, the compliance control techniques in accordance with embodiments enable access to states at greater resistances larger than 10 kohm. Therefore, more bits can be stored per cell because a wider resistance range can be accessed.

As explained above, the OFF-switching may use current compliance or voltage compliance. In current compliance, the OFF-switching of the cell terminates when the specified current limit has been reached. In voltage compliance, the OFF-switching of the cell terminates when the specified voltage limit has been reached. In either case, the specified current or voltage limit corresponds to the level of current or voltage which would be exhibited at the desired level of resistance. For the examples of OFF-switching in FIG. 2, the same level of current compliance (−800 μA) is used to switch from bit values 3, 2, and 1 (curves 210, 208, and 206) to bit value 0 with the highest resistance value (curve 211).

As shown in FIG. 2, the electrical characteristics exhibited by the cell 106 as a result of OFF-switching are dependent on the previous resistance value of the cell. In some cases, the magnitude of the current monotonically increases over time throughout the entire duration of the OFF-switching process. In other words, the instantaneous rate of change in current amplitude with respect to time (dI/dt) is greater than zero throughout the entire OFF-switching process (within the switching zone 222). An example of monotonically increasing current as a result of the OFF-switching is shown by the solid line 206 and the dotted line 208. In some cases, rather than monotonically increasing, the magnitude of the current decreases over a span of time even as the magnitude of the voltage increases (this is because the rate of resistance increase is larger than the rate of voltage ramp, so that $I=V/R$ decreases). In other words, the instantaneous rate of change in current amplitude with respect to time (dI/dt) is less than zero throughout a portion of the switching zone, as shown by the OFF switching of state 3 (the dashed line 210). The time span over which the current magnitude decreases may be referred to as an inflection zone 224, which typically resides within the partial or full range of the switching zone 222. Similarly, the reversal of the current magnitude from increasing current to decreasing current during the switching process may be referred to as an inflection. The lower the initial resistance value, the more likely the cell will exhibit such an inflection during OFF-switching.

If the cell exhibits an inflection during OFF-switching, applying current compliance to obtain a specific desired resistance value may be difficult or impossible. This can be better appreciated with regard to FIG. 4B and the accompanying description. Thus, if the current-voltage characteristics of the cell exhibit an inflection, the final resistance of the cell developed in OFF-switching may be determined using voltage compliance rather than current compliance. In embodiments, it may be possible to predict when an inflection zone may be exhibited based on the known electrical behavior of the cells. For example, it may be known that the cells of a particular storage device will exhibit an inflection zone during OFF-switching when the resistance states for the higher bits are below a certain characteristic value. Thus, the write circuitry may be configured to apply current compliance or voltage compliance based on the current bit value stored to the cell. Further, the selection of the compliance mode may be made prior to switching the cell.

In embodiments, the selection of current compliance or voltage compliance may be selected dynamically. For example, the current through the cell may be measured during OFF-switching in order to detect a potential inflection. If an inflection is detected, the write circuitry may switch from applying current compliance to applying voltage compliance. Other techniques for selecting current compliance or voltage compliance may be implemented in accordance with embodiments, depending on the design choices of the particular implementation. Furthermore, it will be appreciated that ON-switching may also use voltage compliance or current compliance. If the ON-switching current-voltage characteristics of the cell exhibit an inflection zone (not shown), current compliance may not be effective for ON-switching, in which case voltage compliance may be used. Therefore, it will be appreciated that the techniques described herein for selecting between voltage compliance or current compliance are applicable to both OFF-switching and ON-switching.

Figure 3A:
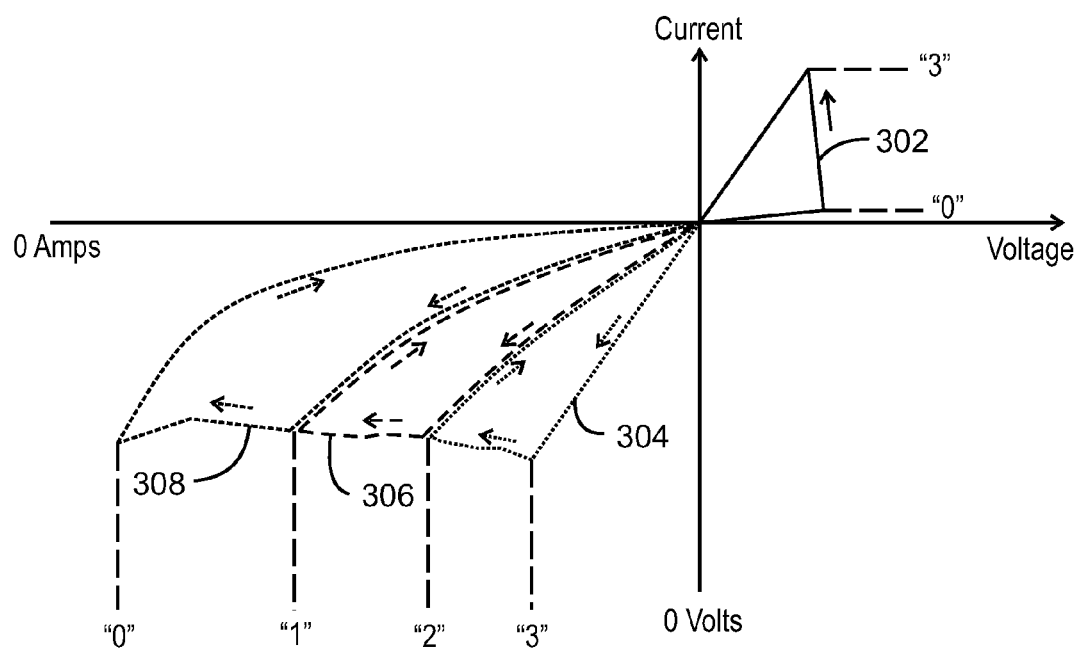
FIGS. 3A and 3B are plots showing examples of switching sequences of a memory cell, in accordance with embodiments.
Figure 3B:
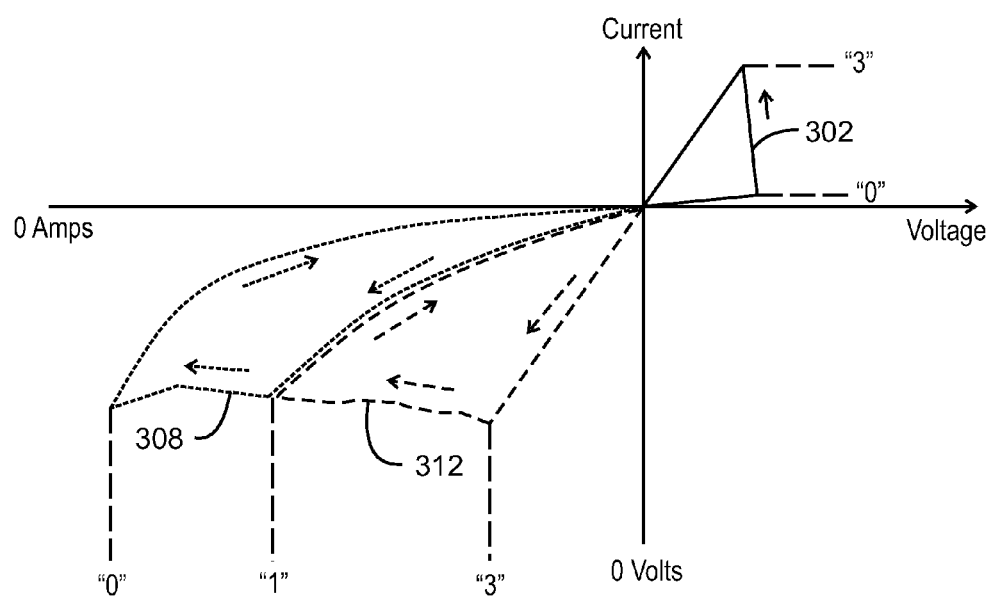

FIGS. 3A and 3B are plots showing examples of switching sequences of a memory cell, in accordance with embodiments. Memory cells in accordance with embodiments have the ability to switch from any resistance state to any other resistance state directly, regardless of the starting resistance. As explained above, the cells 106 (FIG. 1) can be set to a lower resistance state through ON-switching and reset to a higher resistance state through OFF-switching. Plot 300 of FIG. 3A shows an example switching sequence in which the cell 106 is first set from a resistance state corresponding to a bit value of 0 to a bit value of 3, as shown by trace 302. During a subsequent off-switching event, the cell 106 is reset from the bit value of 3 to a bit value of 2, as shown by the trace 304. Based on the plot 300, it can be seen that the cell is reset to the bit value of 2 directly, in one step. During a next switching event, the cell 106 is reset from the bit value of 2 to a bit value of 1, as shown by the trace 306. During the next switching event, the cell 106 is reset from the bit value of 1 to a bit value of 0, as shown by the trace 308.

The plot 310 of FIG. 3B represents the same cell 106 as represented in plot 300, but with a different switching sequence. As shown in the plot 310, the cell 106 is first set from a resistance state corresponding to a bit value of 0 to a bit value of 3, as shown by trace 302. During a subsequent off-switching event, the cell 106 is reset from the bit value of 3 to a bit value of 1 directly, as shown by the trace 312. During the next switching event, the cell 106 is reset from the bit value of 1 to a bit value of 0, as shown by the trace 308. Thus, it can be seen that the order of the switching can be randomized for the memory cell 106. In other words, the cell 106 can be switched to any arbitrary switching state regardless of the history of switching states imposed on the cell 106. It will be appreciated that the plots 300 and 310 are only examples of switching sequences that may be implemented in the cell 106 and that any random order of switching states may be realized in accordance with embodiments.

Figure 4A:
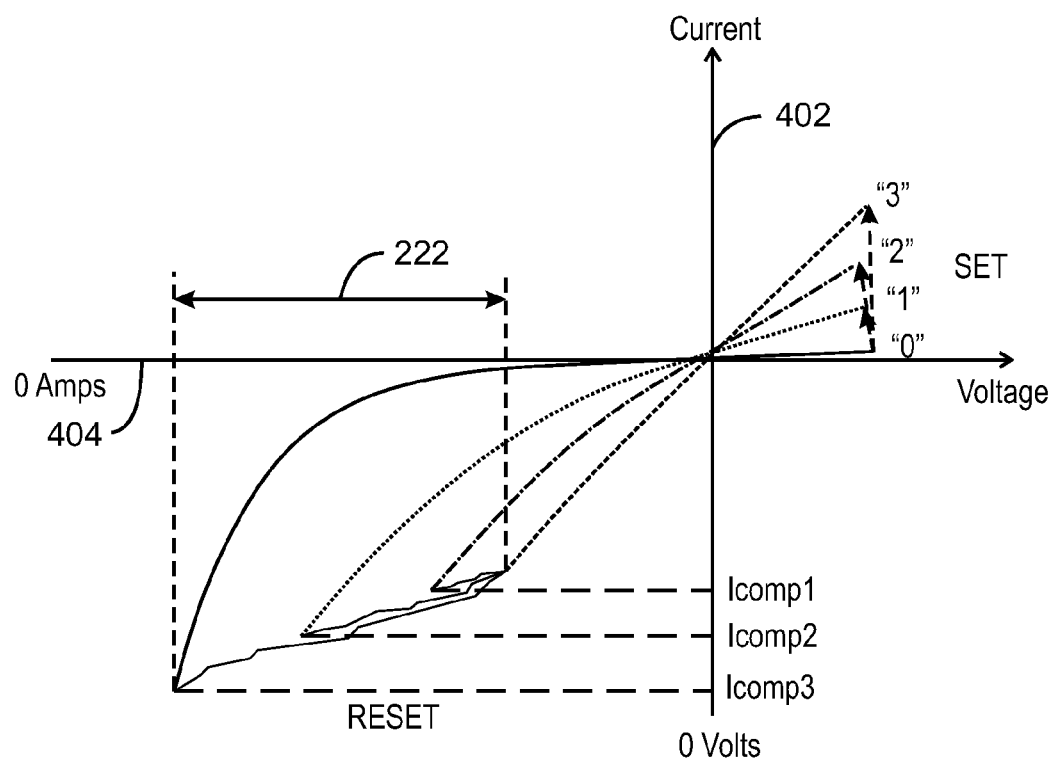
FIG. 4A is a plot showing an example of the current-voltage relationship of a multi-level memory cell using current compliance for the OFF-switching, in accordance with embodiments.

FIG. 4A is a plot showing an example of the current-voltage relationship of a multi-level memory cell using current compliance for the OFF-switching, in accordance with embodiments. The y-axis 402 of the plot 400 represents current, and the x-axis 404 of the plot 400 represents voltage. As shown in FIG. 4A, the example memory cell can have four possible bit values, labeled "0", "1", "2", and "3". As discussed above, the bit value can be set during ON-switching by applying a positive voltage to the memory cell that exceeds the cell's switching threshold and appropriate current compliance levels that determines the final state developed in ON-switching. The memory cell may be reset during OFF-switching by applying a negative voltage to the memory cell that exceeds the cell's switching threshold. The line labeled Icomp1 represents the current compliance used to reset the bit value of the cell to a value of 2, the line labeled Icomp2 represents the current compliance used to reset the bit value of the cell to a value of 1, and the line labeled Icomp3 represents the current compliance used to reset the bit value of the cell to a value of 0. For the example memory cell represented in FIG. 4A, current compliance is used to reset the memory cell because the magnitude of the current through the cell is monotonically increasing throughout the switching zone 222.

Figure 4B:
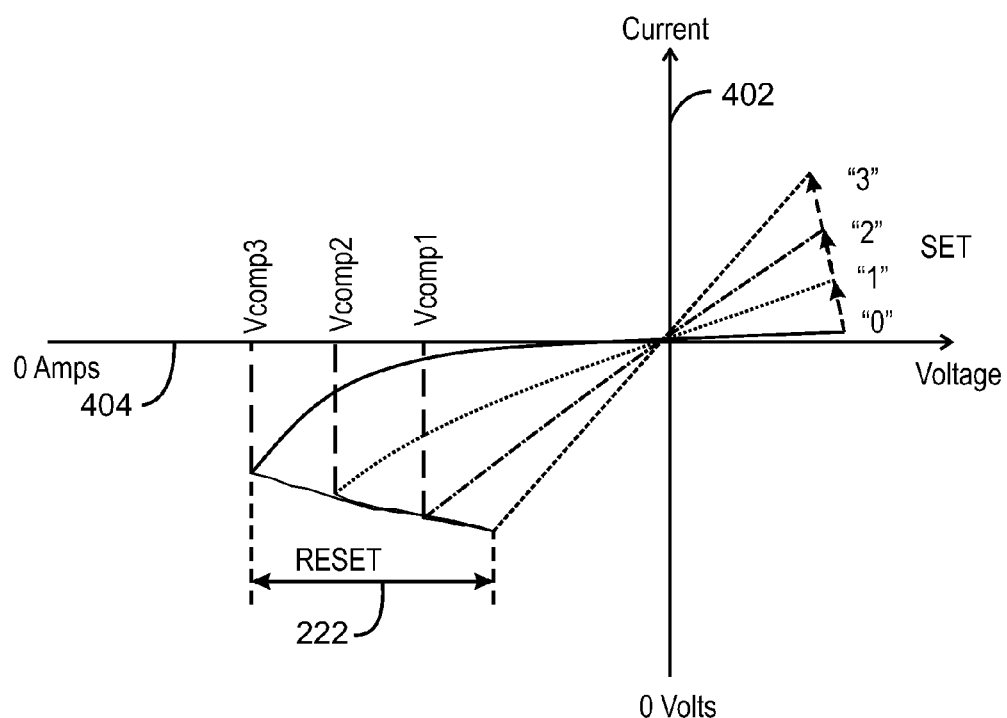
FIG. 4B is a plot showing an example of the current-voltage relationship of a multi-level memory cell using voltage compliance for the OFF-switching, in accordance with embodiments

FIG. 4B is a plot showing an example of the current-voltage relationship of a multi-level memory cell using voltage compliance for the OFF-switching, in accordance with embodiments. As in plot 400 of FIG. 4A, the example memory cell has four possible bit values, labeled "0", "1", "2", and "3", which can be set during ON-switching by applying a positive voltage to the memory cell that exceeds the cell's switching threshold and appropriate current compliance levels that determines the final state developed in ON-switching. As explained above, the memory cell can be reset during OFF-switching by applying a negative voltage to the memory cell that exceeds the cell's switching threshold. As shown in the example plot 408 of FIG. 4B, the line labeled Vcomp1 represents the voltage limit used to reset the bit value of the cell to a value of 2, the line labeled Vcomp2 represents the voltage limit used to reset the bit value of the cell to a value of 1, and the line labeled Vcomp3 represents the voltage limit used to reset the bit value of the cell to a value of 0. For the example memory cell represented in FIG. 4B, voltage compliance is used to reset the memory cell because the magnitude of the current through the cell exhibits an inflection, as shown by the fact that the current decreases throughout the switching zone 222. It can be appreciated that current compliance would not be suitable for OFF-switching the memory cell represented by the plot 408 of FIG. 4B due to the fact that the hypothetical current limit corresponding to a specific bit value would already be exceeded by the current magnitude at the start of OFF switching. Furthermore, it will be appreciated that the plots shown in FIGS. 4A and 4B are examples only. In embodiments, the current-voltage characteristics of a single memory cell may be such that voltage compliance is used during some resets and current compliance is used during other resets, depending on the measured or expected current characteristics of the memory cell for that specific reset.

Figure 5:
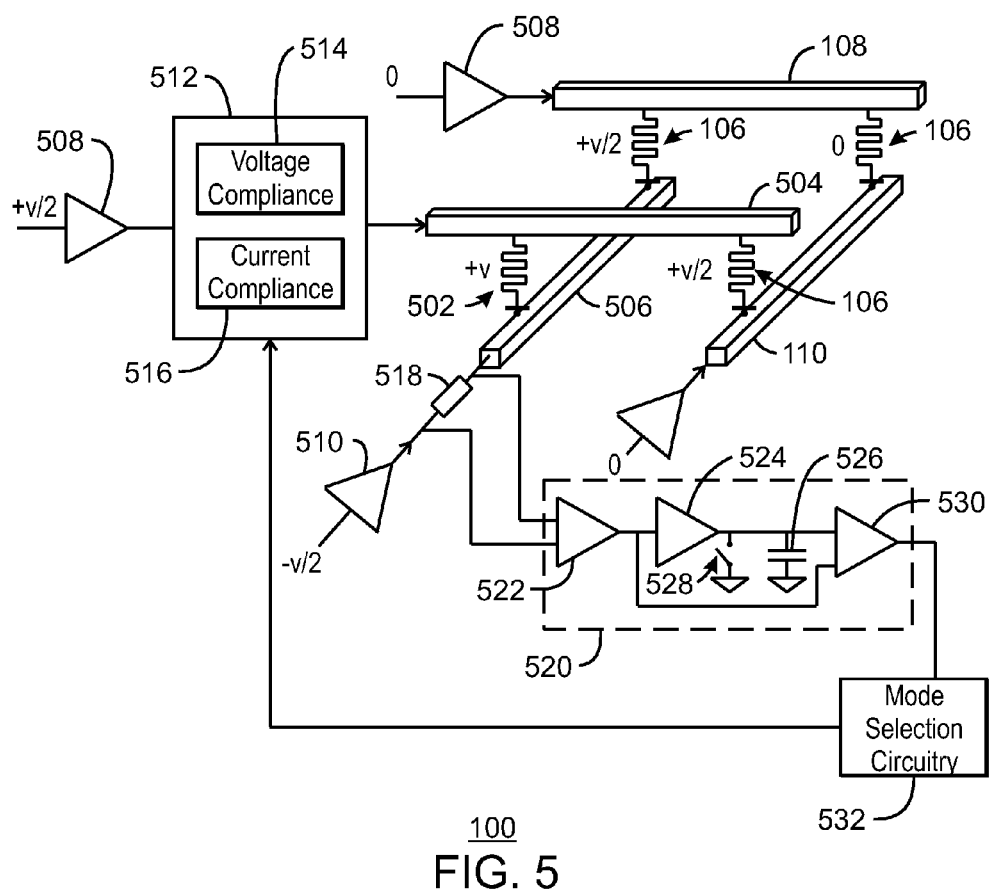
FIG. 5 is block diagram of a data storage device configured to dynamically select a compliance mode during OFF-switching of the memory cells, in accordance with embodiments.

FIG. 5 is block diagram of a data storage device configured to dynamically select a compliance mode during OFF-switching of the memory cells in accordance with embodiments. As shown in FIG. 5, the cell array includes a matrix of cells 106, wherein each cell 106 is electrically coupled to and disposed between a corresponding row line 108 and column line 110. A selected cell, referred to in FIG. 5 with the item number 502, may be addressed by the row line control circuitry 112 and the column line control circuitry 120 (FIG. 1) to read or write the selected cell 502. For the sake of simplicity, the multiplexer and/or demultiplexer circuitry used to address the selected row and column is not shown in FIG. 5. The selected cell 502 is at the cross point of the selected row line 504 and selected column line 506. Row driver circuitry 508 and column driver circuitry 510 is used to write data to the cells 106. As shown in FIG. 5, the selected cell 502 may be written by applying a write voltage, +Vwrite/2, to the selected row line 504 and applying a corresponding write voltage, −Vwrite/2, to the selected column line 506. The row lines 108 and column lines 110 corresponding to the unselected cells may be maintained at zero volts (ground level). It will be appreciated that the specific voltages shown in FIG. 5 are relative. In embodiments, +Vwrite may be applied to the selected row 504, +Vwrite/2 may be applied to the unselected rows 108 and columns 110, and 0 Volts may be applied to the selected column 506.

The data storage device 100 may also include compliance circuitry 512 configured to operate in one of various compliance modes including a voltage compliance mode and current compliance mode. The compliance circuitry 512 may be included in the row line control circuitry and selectively coupled to the selected row line 504 of the selected cell 502. Alternatively, the compliance circuitry 512 may also be included in the column line control circuitry and selectively coupled to the selected column line 506 of the selected cell 502. The compliance circuitry may include voltage compliance circuitry 514 configured to implement voltage compliance and current compliance circuitry 516 configured to implement current compliance. The current compliance circuitry 516 may include a transistor, such as metal-oxide semiconductor field effect transistor (MOSFET) configured as a current limiter. For example, the MOSFET may be operated in saturation mode such that the current through the MOSFET is determined by the gate voltage applied to the gate of the MOSFET. The voltage compliance circuitry 514 may include a voltage regulator with a resistor network, for example.

The data storage device 100 may also include circuitry configured to detect a possible inflection in the current characteristics of the selected cell 502. For example, a current-sensing resistor 518 may be disposed in series with the selected column line 506 of the selected cell 502. The voltage across the resistor 518 may be monitored by the sense circuitry 520, which is configured to detect an inflection. In an embodiment, the sense circuitry 520 may include a voltage amplifier 522, a buffer 524, a sample-and-hold capacitor 526, a switch 528, and a comparator 530. The voltage amplifier 522 includes differential inputs coupled across the resistor 518 to detect the voltage across the resistor 518. The voltage output of the voltage amplifier 522 will be proportional to the current through the selected cell 502. The output of the voltage amplifier 522 may be sent to a buffer 524, which is coupled to a sample-and-hold circuit, such as a capacitor 526. The output of the voltage amplifier 522 and the voltage of the sample-and-hold capacitor 526 may be sent to the comparator 530. If the magnitude of the current through the cell 106 is monotonically increasing, the output of the voltage amplifier 522 will always be greater than or equal to the voltage of the sample-and-hold capacitor 526. However, if the magnitude of the current through the cell 106 decreases as a result of an inflection, the voltage of the sample-and-hold capacitor will be greater than the output of the voltage amplifier 522 and the output of the comparator 530 will be triggered to change from logic low to logic high. In this way, the output of the comparator 530 will indicate whether an inflection has occurred. It will be appreciated that the sense circuitry 520 is only one example of a circuit configuration that can be used to detect an inflection. Other implementations may also work, such as using a high-speed trans-impedance amplifier (TIA) to detect the current through the selected cell.

The output of the sense circuitry 520 may be coupled to a mode selection circuitry 532 configured to select current compliance or voltage compliance based on the output of the sense circuitry 520. The output of the mode selection circuitry 532 may be coupled to the compliance circuitry 512 and configured to activate the voltage compliance circuitry 514 or the current compliance circuitry 516 depending on the outcome of the mode selection. In embodiments, the compliance mode may be selected dynamically. For example, the default compliance mode may be current compliance, and if the mode selection circuitry 532 senses an inflection, the mode selection circuitry 532 may cause a switch from current compliance to voltage compliance, and vice versa.

In embodiments, the compliance mode may be pre-determined. For example, a RESET test may be conducted for each cell or a selected subset of cells, wherein each tested cell is reset from different starting resistance values to determine if an inflection zone exists. The results of the RESET test may be stored to a lookup table that identifies the starting resistance (or the corresponding bit value) and whether or not an inflection was detected. Prior to an actual reset, the current bit value may be read and the lookup table may be searched by the mode selection circuitry to determine which compliance mode should be used for that particular reset. In embodiments, the RESET test may be performed for a representative sample of memory cells such that data storage devices with similarly fabricated cell arrays may be programmed with the same lookup table information. In embodiments wherein the identification of an inflection zone is based on a lookup table generated from a representative sample of memory cells, the circuitry configured to detect an inflection (the resistor 518 and the sense circuitry 520) may not be included in some implementations of the data storage device 100.

In embodiments, the compliance mode selection may be the same for all writes. For example, current compliance may be used for all ON-switching and voltage compliance may be used for all OFF-switching.

The mode selection circuitry 532 may be implemented using any combination of analog and digital circuit components suitable for enabling the mode selection circuitry to identify an inflection zone in the current characteristics of the cell 106 to which it is a coupled. For example, the mode selection circuitry may include operational amplifiers, analog-to-digital converters, comparators, transistors, latches, flip-flops, and logic gates, among others. In an embodiment, the mode selection circuitry may be implemented in an Application Specific Integrated circuit (ASIC), Field Programmable Gate Array (FPGA), and the like. The mode selection circuitry 532 may include memory for storing an operating program of the mode selection circuitry and data collected from the sense circuitry 520. In embodiments, the lookup table is incorporated in the memory of the mode selection circuitry 532. Further, the mode selection circuitry 532 and the compliance circuitry may be implemented as components within the memory controller 104, for example, part of the row line control circuitry 112.

Figure 6:
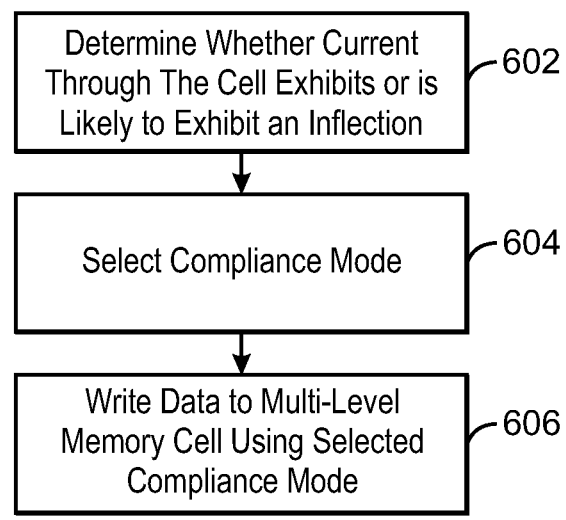
FIG. 6 is a process flow diagram of a method of controlling a data storage device, in accordance with embodiments.

FIG. 6 is a process flow diagram of a method of controlling a data storage device, in accordance with embodiments. The method 600 may be implemented by a memory controller 104 such as the memory controller 104 of FIG. 1. The method may begin at block 602 wherein a determination may be made regarding whether the current through the cell exhibits an inflection. In embodiments, the determination may be made by sensing a current through the multi-level memory cell. In embodiments, the determination may be made based on known electrical characteristics of the cell. For example, it may be known, based on previous measurements of similar cells that the current through the cell is likely to exhibit an inflection when OFF-switching from a particular bit value or resistance level. As described above, the determination of whether the current through the cell exhibits an inflection may be made by reading the current bit value and accessing the lookup table entry for that bit value. Furthermore, the compliance mode may be selected based on whether the cell is being ON-switched to a lower resistance level or OFF-switched to a higher resistance level. For example, current compliance may be used during ON-switching, and either voltage or current compliance may be used during OFF-switching. Furthermore, as explained above, both the ON-switching and the OFF-switching may be continuously tunable.

At block 604, a compliance mode may be selected for writing the memory cell based on the determination made at block 602. As explained above, the compliance mode may be used for setting the resistance level of the multi-level cell. In embodiments, the compliance mode may be selected from the group that includes current compliance and voltage compliance. For example, if current through the cell exhibits an inflection, or is likely to exhibit an inflection based on known electrical characteristics of the cell, then voltage compliance may be selected. Selecting a suitable compliance mode based on the electrical characteristics of the cell enables the use of continuously tunable OFF-switching and ON-switching. Thus, if the cell is switched from a lower resistance state to a higher resistance state, a suitable current or voltage limit can be applied during the writing of the cell to achieve the desired resistance level directly, in other words, without first setting the resistance of the cell to the full off state.

At block 606, data may be written to the multi-level memory cell using the selected compliance mode. In embodiments, writing data to the multi-level memory cell includes setting a resistance level of the multi-level cell, the resistance level corresponding to a desired bit value.

While the present techniques may be susceptible to various modifications and alternative forms, the exemplary embodiments discussed above have been shown only by way of example. It should be understood that the technique is not intended to be limited to the particular embodiments disclosed herein. Indeed, the present techniques include all alternatives, modifications, and equivalents falling within the true spirit and scope of the appended claims.

What is claimed is:

1. A data storage device, comprising:
a multi-level memory cell; and
write circuitry configured to write data to the multi-level memory cell, the write circuitry comprising compliance circuitry configured to implement continuously tunable switching;
wherein the write circuitry is configured to select a compliance mode for the switching, the compliance mode comprising current compliance or voltage compliance.

2. The data storage device of claim 1, wherein the write circuitry is configured to select voltage compliance if current through the multi-level memory cell is likely to exhibit an inflection during OFF-switching or ON-switching.

3. The data storage device of claim 1, wherein the selection of the compliance mode is based, at least in part, on a bit value currently stored to the cell.

4. The data storage device of claim 1, wherein the write circuitry is configured to select voltage compliance if a sensed current through the multi-level memory cell exhibits an inflection during OFF-switching.

5. The data storage device of claim 1, comprising sense circuitry configured to sense a current through the multi-level memory cell during OFF-switching, wherein the write circuitry is configured to dynamically select a compliance mode based on the sensed current.

6. The data storage device of claim 1, comprising sense circuitry configured to sense a current through the multi-level memory cell during OFF-switching, wherein the write circuitry is configured to perform a RESET test for one or more of the multi-level memory cells to identify inflection zones and save the results of the RESET test to a lookup table, which is used by the mode selection circuitry to identify whether a cell is likely to exhibit an inflection zone during an actual reset of one of the multi-level memory cells.

7. The data storage device of claim 1, wherein the write circuitry comprises voltage compliance circuitry and current compliance circuitry, and wherein the mode selection circuitry is configured to activate either the voltage compliance circuitry or the current compliance circuitry depending on the selected compliance mode.

8. An electronic device, comprising:
a memory array comprising a matrix of multi-level cells; and
a memory controller configured to write data to the memory array, the memory controller comprising:
write circuitry configured to write data to the multi-level cells by setting a resistance level of the multi-level cells, the write circuitry comprising compliance circuitry configured to implement continuously tunable switching;
wherein the write circuitry is configured to select a compliance mode for the switching, the compliance mode being selected from the group comprising current compliance and voltage compliance.

9. The electronic device of claim 8, wherein the write circuitry is configured to select the compliance mode based on whether current through a selected one of the multi-level cells exhibits or is likely to exhibit an inflection during OFF-switching or ON-switching.

10. The electronic device of claim 9, wherein selecting the compliance mode comprises selecting current compliance if the current does not exhibit an inflection and selecting voltage compliance if the current does exhibit an inflection.

11. The electronic device of claim 8, wherein the write circuitry comprises mode selection circuitry configured to sense a current through the multi-level memory cell during OFF-switching, wherein the write circuitry is configured to dynamically select a compliance mode based on the sensed current.

12. The electronic device of claim 8, wherein the write circuitry is configured to select a compliance mode based on a bit value currently stored to the cell.

13. The electronic device of claim 8, wherein the electronic device comprises a general purpose computer, printer, copier, mobile phone, smart phone, or tablet PC.

* * * * *